United States Patent [19]

Eden

[11] Patent Number: 4,816,963
[45] Date of Patent: Mar. 28, 1989

[54] APPARATUS FOR PROTECTING A TRANSISTOR IN THE EVENT OF A SHORTED LOAD CONDITION

[75] Inventor: Gary M. Eden, Elwood, Ind.

[73] Assignee: General Motors Corporation, Detroit, Mich.

[21] Appl. No.: 135,943

[22] Filed: Dec. 21, 1987

[51] Int. Cl.⁴ ............................................... H02H 3/87
[52] U.S. Cl. ...................................... 361/101; 361/91; 361/93; 330/298; 330/207 P
[58] Field of Search ................... 361/87, 93, 91, 101; 330/207 P, 298

[56] References Cited

U.S. PATENT DOCUMENTS

| | | | |
|---|---|---|---|
| 4,497,010 | 1/1985 | Funahashi | 361/93 |
| 4,581,551 | 4/1986 | Campbell, Jr. | 307/475 |
| 4,651,252 | 3/1987 | Babinski | 361/93 |
| 4,669,026 | 5/1987 | Wedlar | 361/103 |
| 4,736,267 | 4/1988 | Karlman et al. | 361/101 |

*Primary Examiner*—Philip H. Leung
*Assistant Examiner*—Derek S. Jennings
*Attorney, Agent, or Firm*—Tim G. Jaeger

[57] ABSTRACT

A transistor is protected from excessive power dissipation in the event of a shorted load condition by alternately turning the transistor off for a relatively long period of time during which a capacitor is discharged through a resistor network and turning the transistor on for a relatively short period of time during which the capacitor is charged through a diode by the voltage developed across a resistor connected in circuit with the transistor.

1 Claim, 1 Drawing Sheet

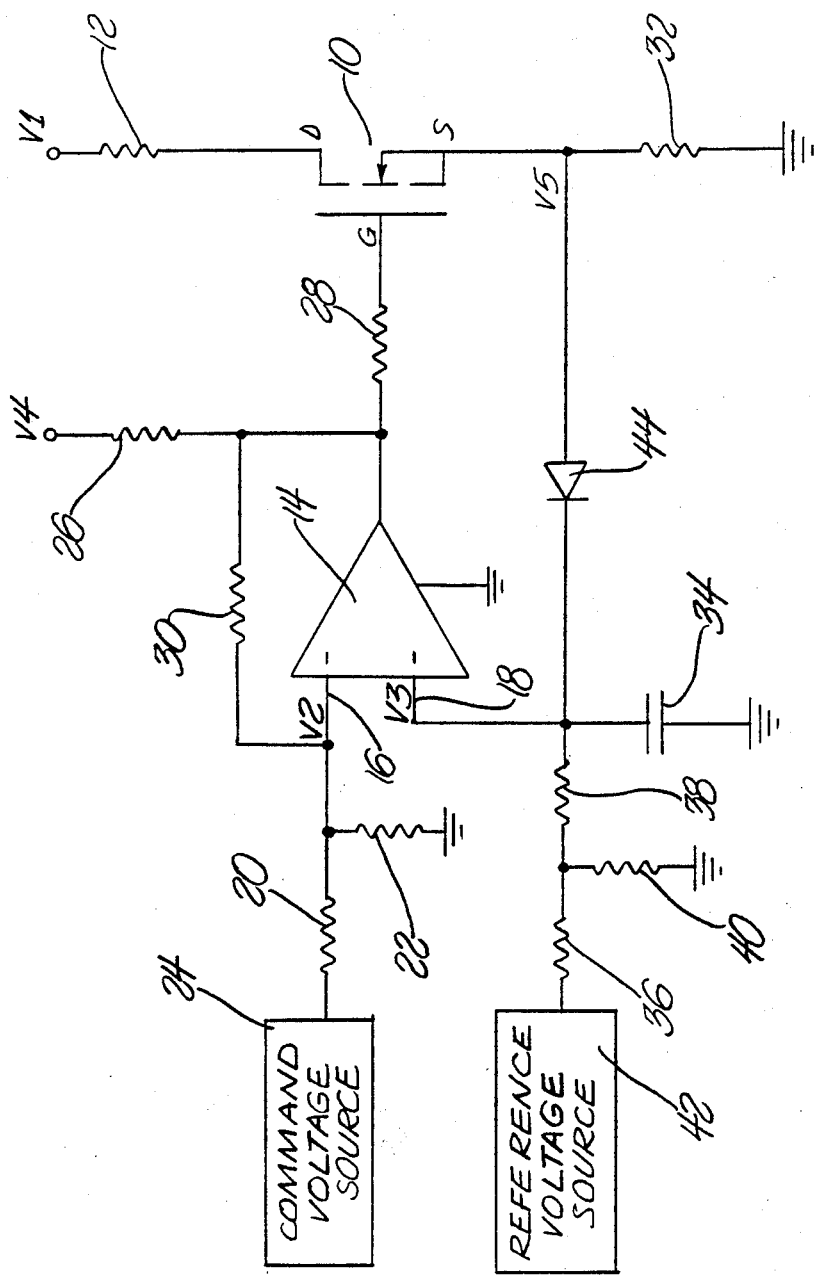

APPARATUS FOR PROTECTING A TRANSISTOR IN THE EVENT OF A SHORTED LOAD CONDITION

This invention relates to an arrangement for protecting a transistor from excessive power dissipation in the event that the load energized through the transistor becomes short circuited in some manner.

According to one aspect of the invention, the transistor to be protected is driven by a comparator. Specifically, the comparator is responsive to a command voltage applied at a first input and a reference voltage applied at a second input to turn on the transistor when the command voltage exceeds the reference voltage and to turn off the transistor when the reference voltage exceeds the command voltage. In turn, the command voltage is provided at a turn on level when it is desired to turn on the transistor and is provided at a turn off level lower than the turn on level when it is desired to turn off the transistor.

In another aspect of the invention, a sensor resistor is connected in circuit with the transistor and the load such that a sensor voltage is developed across the resistor. With the transistor turned on, the sensor voltage is at a normal level when the load is not shorted and is at an abnormal level higher than the normal level when the load is shorted. With the transducer turned off, the sensor voltage is at a base level lower than the normal level.

In a further aspect of the invention, the reference voltage is developed across a capacitor. Normally, the reference voltage is maintained at a nominal level intermediate the turn on and turn off levels of the command voltage such that the transistor is turned on when the command voltage is at the turn on level and is turned off when the command voltage is at the turn off level.

Pursuant to a still further aspect of the invention, a diode is connected between the sensor resistor and the capacitor. The diode is reverse biased when the sensor voltage is at the normal level which is below the nominal level of the reference voltage. Conversely, the diode is forward biased when the sensor voltage is at the abnormal level which is above the nominal level of the reference voltage. With the diode forward biased, the capacitor is rapidly charged to increase the reference voltage toward the abnormal level until it rises above the command voltage whereupon the transistor turns on. With the transistor turned on, the sensor voltage drops to the base level and the diode is again reverse biased.

In an additional aspect of the invention, means are provided for discharging the capacitor to slowly decrease the reference voltage back toward the nominal level. When the reference voltage falls below the command voltage, the transistor is again turned on. With the transistor turned on, the reference voltage is rapidly increased back above the command voltage thereby to turn off the transistor. With the transistor turned off, the reference voltage is slowly decreased until it falls below the turn on level of the command voltage whereupon the transistor turns off, and the cycle is repeated. So long as the load is shorted and the command voltage is at the turn on level, the transistor is alternately turned on for a relatively short period of time and is turned off for a relatively long period of time thereby to protect the transistor from excessive power dissipation.

The foregoing and other aspects and advantages of the invention may be best understood by reference to the following detailed description of a preferred embodiment when taken in conjunction with the accompanying drawing in which the sole figure is a schematic diagram of the described embodiment.

The accompanying drawing in which the sole FIGURE is a schematic diagram of the described embodiment.

Referring to the drawing, a transistor 10 to be protected is connected in series with a load 12. When the transistor 10 is turned on, the load 12 is energized from a voltage V1. When the transistor 10 is turned off, the load 12 is deenergized. For purposes of illustration, the transistor 10 is depicted as an N-channel field effect transistor and the load 12 is depicted as a resistor; however, it will be understood that the invention may be practiced with any suitable transistor and load.

A comparator 14 is responsive to a command voltage V2 applied at a first input 16 and a reference voltage V3 applied at a second input 18. When the command voltage V2 exceeds the reference voltage V3, the transistor 10 is turned on. When the reference voltage V3 exceeds the command voltage V2, the transistor 10 is turned off. The command voltage V2 is provided via voltage divider resistors 20 and 22 from a command voltage source 24 such that the command voltage V2 is at a predetermined turn on level when it is desired to turn on the transistor 10 and is at a predetermined turn off level lower than the turn on level when it is desired to turn off the transistor 10.

More specifically, when the command voltage V2 exceeds the reference voltage V3, the output of the comparator 14 is released from a low potential, i.e., near ground potential, and the transistor 10 is turned on via the biasing action of resistors 26 and 28 connected between the input or gate electrode of the transistor 10 and a source of voltage V4. At the same time, the command voltage V2 at the first input 16 of the comparator 14 is raised by an incremental hysteresis voltage Vh via the voltage divider action of resistors 22, 26 and 30 in conjunction with voltage V4. The resistor 28 serves to prolong the switching time of the transistor 10 to reduce higher harmonic noise. If this latter feature is not desired, the resistor 28 may be eliminated.

A sensor resistor 32 is connected in circuit with the transistor 10 and the load 12 such that a sensor voltage V5 is developed across the resistor 32. With the transistor 10 turned on, the sensor voltage V5 is at a normal level when the load 12 is not shorted and is at an abnormal level higher than the normal level when the load 12 is shorted in any manner. With the transistor 10 turned off, the sensor voltage V5 is at a base level, i.e., ground level, lower than the normal level.

The reference voltage V3 is developed across a capacitor 34. Normally, the reference voltage V3 is maintained via the voltage divider action of resistors 36, 38 and 40 in conjunction with a reference voltage source 42 at a nominal level intermediate the turn on and turn off levels of the command voltage V3. As a consequence, the transistor 10 is turned on when the command voltage V2 is at the turn on level and is turned off when the command voltage V2 is at the turn off level.

A diode 44 is connected between the sensor resistor 26 and the capacitor 28. The diode 44 is reverse biased when the sensor voltage V5 is at the normal level which is below the nominal level of the reference voltage V3. Conversely, the diode 44 is forward biased when the sensor voltage V5 is at the abnormal level which is above the nominal level of the reference voltage V3. With the diode 44 forward biased, the capacitor 34 is rapidly charged to increase the reference voltage V3 toward the abnormal level until it rises above the command voltage V2 whereupon the transistor 10 turns on. With the transistor 10 turned on, the sensor voltage V5 drops to the base level and the diode 44 is again reverse biased.

With the diode 44 reverse biased, the capacitor 34 discharges through the resistors 38 and 40 to slowly decrease the reference voltage V3 back toward the nominal level. When the reference voltage V3 falls below the turn on level of the command voltage V2, the transistor 10 is again turned on. With the transistor 10 turned on, the reference voltage V3 is rapidly increased back above the command voltage V2 thereby to turn off the transistor 10. With the transistor 10 turned off, the reference voltage V3 is slowly decreased until it falls below the turn on level of the command voltage V2 whereupon the transistor 10 turns off—and the cycle is repeated.

Accordingly, so long as the load 12 is shorted and the command voltage V2 is at the turn on level, the transistor 10 is alternately turned on for a relatively short period of time and is turned off for a relatively long peroid of time thereby to protect the transistor 10 from excessive power dissipation.

It will be understood that the foregoing is a disclosure of a preferred embodiment of the invention and that other embodiments are possible within the spirit and scope of the invention.

What is claimed is:

1. For a circuit including a load and a transistor for driving the load such that when the transistor is turned on the load is energized and when the transistor is turned off the load is deenergized, apparatus for protecting the transistor from excessive power dissipation should the load become shorted, comprising:

a comparator connected to the transistor and responsive to a command voltage applied to a first input and a reference voltage applied to a second input to turn on the transistor when the command voltage exceeds the reference voltage and to turn off the transistor when the reference voltage exceeds the command voltage;

means for providing the command voltage at the first input of the comparator such that the command voltage is at a turn on level when it is desired to turn on the transistor and is at a turn off level lower than the turn on level when it is desired to turn off the transistor;

a sensor resistor connected in circuit with the transistor and the load so as to develop a sensor voltage across the sensor resistor such that when the transistor is turned on the sensor voltage is at a normal level when the load is not shorted and is at an abnormal level higher than the normal level when the load is shorted and such that when the transistor is turned off the sensor voltage is at a base level lower than the normal level;

means for providing the reference voltage at the second input of the comparator including:

a capacitor across which the reference voltage is developed, means for normally maintaining the reference voltage at a nominal level intermediate the turn on and turn off levels of the command voltage such that the transistor is turned on when the command voltage is at the turn on level and is turned off when the command voltage is at the turn off level, a diode connected between the sensor resistor and the capacitor such that the diode is reverse biased when the sensor voltage is at the normal level which is below the nominal level of the reference voltage and is forward biased when the sensor voltage is at the abnormal level which is above the nominal level of the reference voltage so as to rapidly charge the capacitor to increase the reference voltage toward the abnormal level until it rises above the command voltage whereupon the transistor turns off and the sensor voltage drops to the base level thereby to reverse bias the diode, and means for discharging the capacitor to slowly decrease the reference voltage toward the nominal level until it falls below the command voltage whereupon the transistor briefly turns on to rapidly increase the reference voltage back above the command voltage thereby to turn off the transistor, so that as long as the load is shorted and the command voltage is at the turn on level the transistor is alternately turned on for a relatively short period of time and is turned off for a relatively long period of time to protect the transistor from excessive power dissipation.

* * * * *